(12) United States Patent
Chen et al.

(10) Patent No.: US 6,288,951 B1
(45) Date of Patent: Sep. 11, 2001

(54) METHOD AND APPARATUS FOR CONTINUOUSLY REGULATING A CHARGE PUMP OUTPUT VOLTAGE USING A CAPACITOR DIVIDER

(75) Inventors: Pau-Ling Chen, Saratoga; Binh Quang Le, San Jose, both of CA (US)

(73) Assignee: Advanced Micro Devices, Sunnyvale, CA (US)

(*) Notice: Subject to any disclaimer, the term of this patent is extended or adjusted under 35 U.S.C. 154(b) by 0 days.

(21) Appl. No.: 09/675,940

(22) Filed: Sep. 29, 2000

(51) Int. Cl.[7] ................................................ G11C 7/00
(52) U.S. Cl. ...................... 365/189.09; 365/226; 365/239
(58) Field of Search .................... 365/189.09, 189.07, 365/226, 189.11, 239

(56) References Cited

U.S. PATENT DOCUMENTS

| | | | |
|---|---|---|---|
| 5,754,476 | * 5/1998 | Caser et al. | 365/85.29 |
| 5,808,506 | * 9/1998 | Tran | 327/537 |
| 5,831,845 | * 11/1998 | Zhou et al. | 363/60 |
| 5,933,047 | * 8/1999 | Zhu et al. | 327/534 |
| 6,078,212 | * 6/2000 | Iakhani | 327/536 |
| 6,144,606 | * 11/2000 | Pan | 365/226 |

* cited by examiner

Primary Examiner—David Nelms
Assistant Examiner—Thong Le
(74) Attorney, Agent, or Firm—Fliesler, Dubb, Meyer & Lovejoy LLP

(57) ABSTRACT

A non-volatile memory and method for continuously regulating an output of a charge pump of the non-volatile memory for long periods of time at a target output voltage.

18 Claims, 3 Drawing Sheets

US 6,288,951 B1

METHOD AND APPARATUS FOR CONTINUOUSLY REGULATING A CHARGE PUMP OUTPUT VOLTAGE USING A CAPACITOR DIVIDER

BACKGROUND OF THE INVENTION

1. Field of the Invention

The present invention generally relates to voltage regulation, and more particularly, to a method and apparatus for continuously regulating an output voltage of the charge pump using a capacitor divider network.

2. Description of the Related Art

A non-volatile memory powered from a single low voltage power supply, $V_{CC}$, typically employs a multi-phase voltage or charge pump to boost $V_{CC}$ to a high voltage VPP required for programming and erase operations. Further details for providing a multi-phase charge pump can be found in U.S. Pat. No. 5,263,000 by Van Buskirk entitled "Drain Power Supply" and U.S. Pat. No. 5,511,026 by Cleveland entitled "Boosted And Regulated Gate Power Supply With Reference Tracking For Multi-Density And Low-Voltage Supply Memories", both incorporated by reference herein. The boosted voltage is regulated to provide stable programming and erase voltages.

FIG. 1 shows a voltage output of charge pump 110 of a non-volatile memory regulated by regulator 120 to generate a constant output voltage VPP. FIG. 2 illustrates a circuit diagram of a typical prior art regulator 120. The supply voltage $V_{CC}$ powering both charge pump 110 and regulator 120 is, for example, 3 V and the target output voltage of charge pump 110, $V_{target}$, is, for example, 9.5 V (it should be noted that all voltage values used herein are approximate values).

Accordingly, if capacitors C1 and C2 are metal capacitors, the voltage at node A is 0 V when the Enable (EN) input is at a logic LOW level and when the initial voltage of VPP is 3 V.

However, once an erase operation, for example, is initiated, the EN input transitions to a logic HIGH voltage level. This turns on P-MOS transistor $T_1$, and the voltage at node A subsequently increases as charge pump 110 charges up the voltage at nodes B and D to VPP. The voltage at node C remains at 0 V until the voltage at node A exceeds a fixed reference voltage $V_{ref}$. The target output voltage of charge pump 110 is at all times proportional to a ratio of the values of capacitors C1 and C2. The following equation expresses this relationship:

$$V_{target} = V_{ref}\left(1 + \frac{C_2}{C_1}\right) \quad (1)$$

For certain values of capacitors C1 and C2, the voltage at node A is 1.3 V if the target voltage is 9.5 V. However, if charge pump 110 charges VPP beyond the target voltage of 9.5 V, the voltage at node A rises above 1.3 V, and the output of comparator 210 (node C) will transition to a logic HIGH voltage level (since $V_{ref}$ is fixed at, for example, 1.3 V). This turns on transistor T2 and transistor T2 discharges VPP back down to the target voltage of 9.5 V.

While this feedback mechanism can be effective in regulating VPP to the target voltage, prior art regulator 120 is only effective for regulating relatively short output voltage pulses of charge pump 110 (e.g., up to 2–3 msec). This is because capacitors C1 and C2, like all capacitors, leak charge over time. Consequently, if the output voltage pulses of charge pump 110 were, for example, 20 msec long, the steady state voltage at node A progressively dips below 1.3 V (under normal circumstances, the voltage at node A is 1.3 V when $V_{PP}$ is charged up to the target voltage of 9.5 V). In response, prior art regulator 120 compensates for this change in the voltage of node A by increasing the voltage at node B. In other words, regulator 120 tries to "pull" the voltage at node A back up to 1.3 V by increasing the voltage at node B. The only way regulator 120 can increase the voltage at node B is to increase the voltage at node D, or VPP.

Thus, for long output voltage pulses of charge pump 110, regulator 120 must increase VPP beyond the target voltage of 9.5 V to maintain the voltage of node A at 1.3 V. Regulator 120 may have to increase VPP to, for example, 11 V in order to maintain 1.3 V at node A. This result is undesirable because regulator 120 should regulate the voltage output of charge pump 110 at the target voltage (e.g., 9.5V) and not at any other voltage. Accordingly, there is a need for a regulator comprising a capacitor divider network that is capable of continuously regulating the output of charge pump 110 at some target voltage. A further understanding of the nature and advantages of the present invention may be realized by reference to the remaining portions of the specification and the drawings.

SUMMARY OF THE INVENTION

The invention, roughly described, provides a method and apparatus for continuously regulating an output voltage of a charge pump of a non-volatile memory using a capacitor divider network. In particular, the invention provides a method for continuously regulating an output voltage of a non-volatile memory for long periods of time to a target output voltage wherein the non-volatile memory comprises a first regulator and a second regulator and the method comprises the steps of regulating the output voltage to the target voltage with the first regulator for a first period of time, inactivating the first regulator for a second period of time at the end of the first period of time, regulating said output voltage to the target voltage with the second regulator for a third period of time, at the end of the second period of time, while the first regulator is inactive, inactivating the second regulator for a fourth period of time at the end of the third period of time, and repeating the above steps at the end of the fourth period of time for as long as the output voltage needs to be regulated.

In one embodiment, the present invention is incorporated within a non-volatile memory comprising a charge pump and a regulator. The regulator comprises a first regulator sub-circuit, and a second regulator sub-circuit, each having a capacitor divider network. The first regulator sub-circuit regulates an output voltage of the charge pump at a target output voltage while the second regulator sub-circuit is disabled and said second regulator regulates the output voltage of the charge pump at the target output voltage while said first regulator sub-circuit is disabled.

Specifically, the first regulator sub-circuit regulates the output voltage of the charge pump at the target output voltage for a first period of time while the second regulator sub-circuit is disabled and, at the end of the first period of time, the first regulator sub-circuit is disabled for a second period of time and the second regulator sub-circuit is enabled so as to regulate the output voltage of the charge pump at the target output voltage for a third period of time while the second regulator sub-circuit is disabled. At the end of the third period of time, the second regulator sub-circuit is disabled for a fourth period of time and the first regulator sub-circuit is again enabled for the first period of time. By alternatively using the first and second regulator sub-circuits to regulate the output voltage of the charge pump at the target voltage, the present invention can regulate the output of the charge pump virtually indefinitely.

BRIEF DESCRIPTION OF THE DRAWINGS

The present invention will be described with respect to the particular embodiments thereof. Other objects, features, and advantages of the present invention will become apparent with reference to the specification and drawings in which.

DETAILED DESCRIPTION

Figure 1:
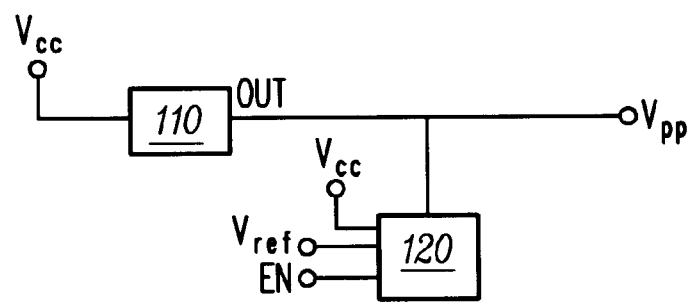
FIG. 1, described above, is a block diagram of a charge pump and a prior art voltage regulator.
Figure 2:
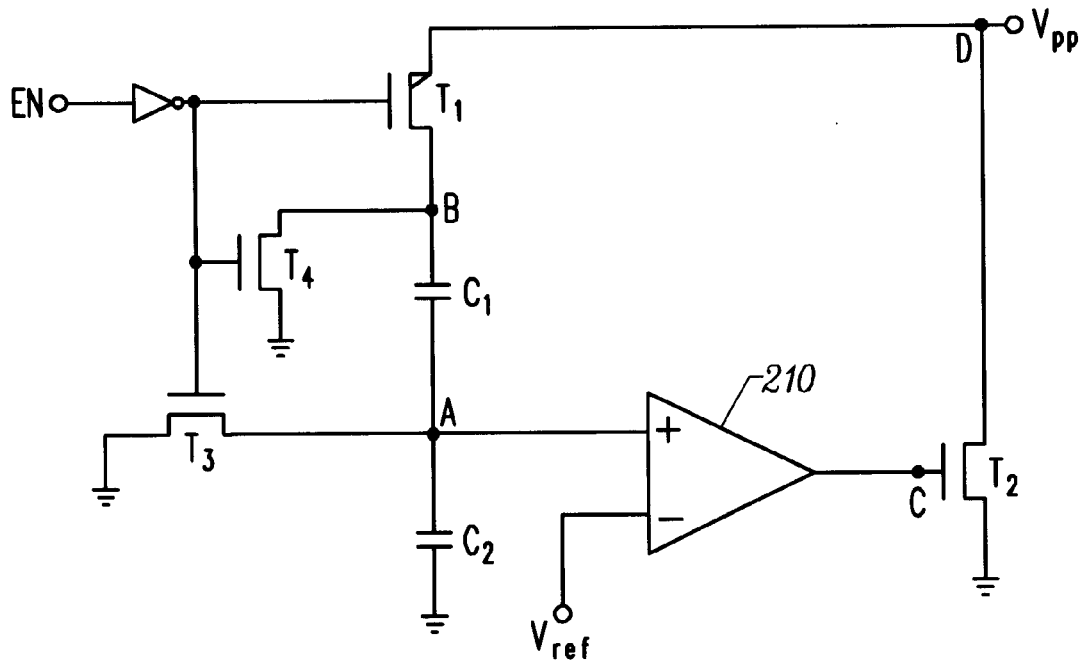
FIG. 2 is a schematic diagram of a prior art regulator.
Figure 3:
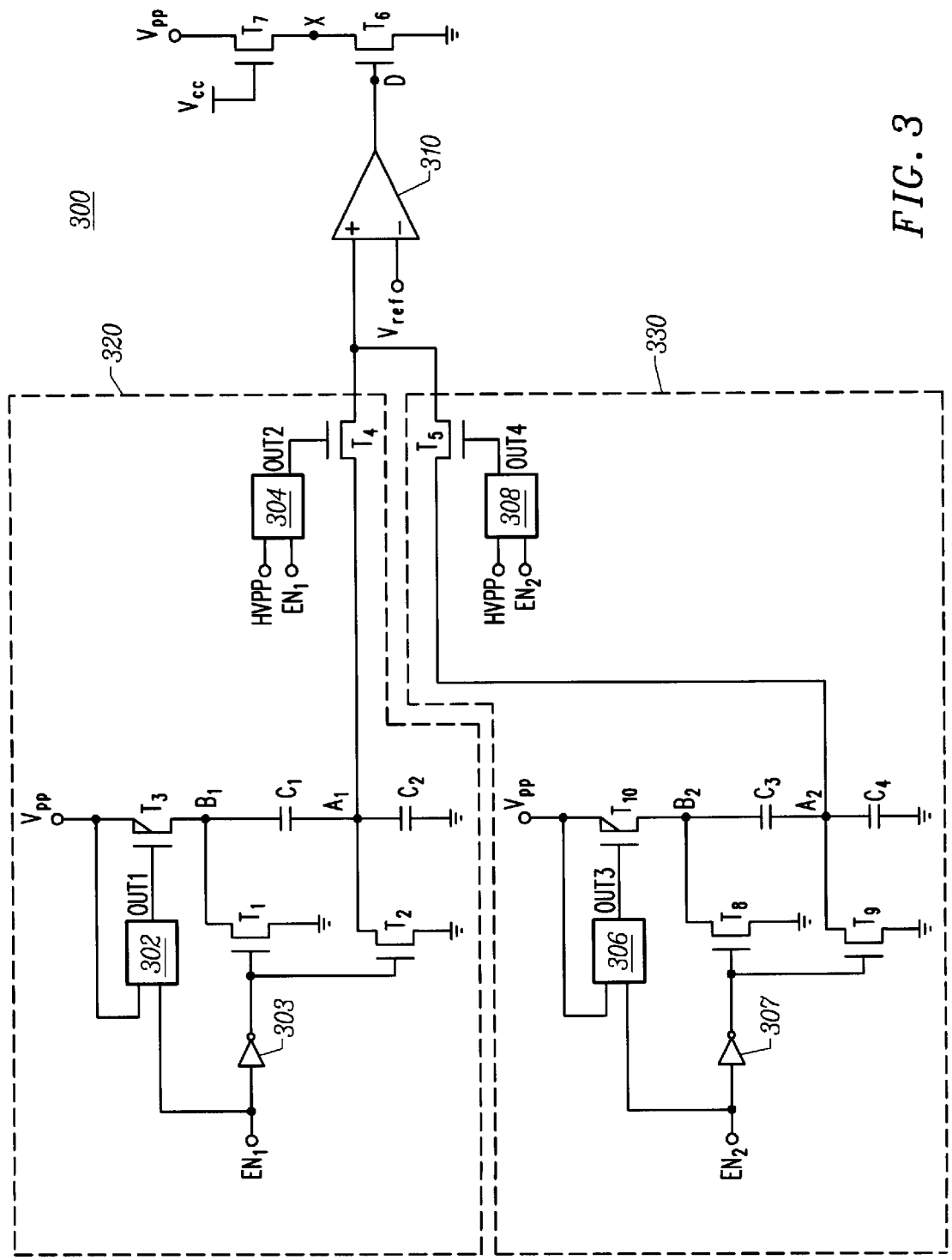
FIG. 3 is a schematic diagram of an improved regulator in accordance with an embodiment of the present invention.

FIG. 3 is a schematic diagram of an improved regulator 310 for continuously regulating a charge pump output voltage of a non-volatile memory at a target output voltage in accordance with an embodiment of the present invention. Regulator 310 integrates the function of two regulators into one, a first regulator sub-circuit 320 and a second regulator sub-circuit 330.

First regulator sub-circuit 320 comprises inverter 303, n-channel transistors T1 and T2, p-channel transistor T3, circuit block 302, and a capacitor divider network comprising capacitors C1 and C2. At any given time, only one of either first regulator sub-circuit 320 and second regulator sub-circuit 330 are active or enabled. Consider, first, the situation where first regulator sub-circuit 320 is active or enabled and second regulator sub-circuit 330 is inactive or disabled. Accordingly, enable input EN1 is in a logic HIGH state and enable input EN2 is in a logic LOW state.

A skilled artisan will recognize that if EN1 is in a logic HIGH state, n-channel transistors T1 and T2 are turned OFF and the voltage at nodes A1 and B1, and the voltage at output OUT1 of level shifting high voltage switch 302 (as discussed below with respect to FIG. 3A), are pulled down to a ground potential or 0 V. P-channel transistor T3 is turned ON when the voltage at output OUT1 is 0 V and node B1 is thereby connected to VPP. The voltage at node B1 will thus increase to and eventually settle at VPP or 9.5 V and, for certain values of C1 and C2, the voltage at node A1 will eventually settle at 1.3 V. At the same time, as discussed below with respect to FIG. 3B, a logic HIGH signal on EN1 produces a voltage at output OUT2 that is equivalent to one-half of VPP or approximately 4.75 V. A high voltage of 4.75 V is used to reduce the resistance of transistor T4. Transistor T4 is turned ON, thereby connecting node A1 to comparator 310, and comparator 310 thus compares the voltage at node A1 against a reference voltage Vref.

In an embodiment of the present invention, Vref is fixed at 1.3 V and comparator 310 generates a logic HIGH output at node D if the voltage at node A1 exceeds 1.3 V. This will happen if, for example, VPP is charged up beyond the target voltage of 9.5 V. If this happens, n-channel transistor T6 is turned ON and VPP is incrementally discharged until the voltage at node A1 decreases to 1.3 V or less. When this happens, comparator 310 is turned OFF and the resulting 0 V on node D turns OFF transistor T6. VPP is thus regulated at the target voltage. An artisan skilled in the art will readily recognize that by choosing capacitors with the appropriate values, the present invention can regulate VPP to virtually any desired target voltage. The artisan will also realize that transistor T7 prevents the occurrence of a parasitic phenomenon known as hot-switching by ensuring that 9.5 V (VPP) does not appear across transistors T6 and T7.

Meanwhile, second regulator sub-circuit 330 is inactive or disabled and enable input EN2 is in a logic LOW state. A logic LOW state on EN2 initially turns on n-channel transistors T8 and T9. The voltages at nodes A2 and B2 are subsequently pulled down to a ground potential or 0V. Simultaneously, the voltage at output OUT3 of level shifting high voltage switch 306 (as discussed below with respect to FIG. 3A) increases to VPP and the voltage at output OUT4 of medium voltage switch 308 (as discussed below with respect to FIG. 3B) is pulled down to a ground potential or 0 V. 0 V on OUT4 turns OFF transistor T5 and second regulator sub-circuit 330 is decoupled from comparator 310 and the rest of regulator 300. Thus, when second regulator sub-circuit is inactive, the voltage at nodes A2 and B2 is 0 V and node A2 is decoupled from comparator 310.

After first regulator sub-circuit 320 has been enabled or active for a period of time, and before capacitor leakage can cause VPP to shift beyond a predetermined tolerance level (e.g., 200 mV), first regulator sub-circuit 320 is disabled with a logic LOW signal on enable input EN1 and, simultaneously, second regulator sub-circuit 330 is enabled with a logic HIGH signal on enable input EN2. A logic LOW signal on EN1 causes n-channel transistors T1 and T2 to be turned ON and the voltage at output OUT1 of level shifting high voltage switch 302 (as discussed below with respect to FIG. 3A) to be pulled up to VPP or 9.5 V. The voltage at nodes A1 and B1 are thus pulled down to a ground potential or 0V, and 9.5 V on OUT1 causes transistor T3 to be turned OFF.

Simultaneously, a logic LOW signal on EN1 causes the output OUT2 of medium voltage switch 304 (as discussed below with respect to FIG. 3B) to be pulled down to a ground potential or 0 V. This turns OFF transistor T4 and decouples first regulator sub-circuit 320 from the rest of regulator 300. Thus, when first regulator sub-circuit 320 is inactive, nodes A1 and B1 are both at a ground potential or 0 V and node A1 of first regulator sub-circuit 320 is electrically decoupled from comparator 310.

While first regulator sub-circuit 320 is being disabled or "re-initialized," second regulator sub-circuit 330 is enabled and by placing a logic HIGH signal on EN2. Accordingly, n-channel transistors T8 and T9 are turned OFF and output OUT3 of level shifting high voltage switch 302 (as discussed below with respect to FIG. 3A) is pulled down to a ground potential or 0 V. 0 V on OUT3 turns on transistor T3 and node B2 is thereby connected to VPP. The voltage at node B2 eventually increases to VPP or 9.5 V and, for certain values of C3 and C4, the voltage at node A2 will eventually settle at 1.3 V.

At the same time, a logic HIGH signal on EN2 causes the voltage at output OUT4 of medium voltage switch 308 (as discussed below with respect to FIG. 3B) to be pulled up to about one-half of VPP or 4.75 V. A voltage of 4.75 V on OUT4 turns ON transistor T4, and the voltage at node A2 is compared to Vref at comparator 310. Again, Vref is fixed at 1.3 V and comparator 310 generates a logic HIGH output at node D if the voltage at node A2 ever exceeds 1.3 V. This will happen if, for example, VPP is charged up beyond the target voltage of 9.5 V. If this happens, transistor T6 is turned ON and VPP is incrementally discharged until the voltage at node A2 decreases to 1.3 V or less. When this happens, the output of comparator 310 is turned OFF and the resulting 0 V on node D turns OFF transistor T6.

After second regulator sub-circuit 330 has been enabled or active for a period of time, and before capacitor leakage can cause VPP to shift beyond a predetermined tolerance level (e.g., 200 mV), second regulator sub-circuit 330 is disabled with a logic LOW signal on enable input EN2 and first regulator sub-circuit 320 is again enabled with a logic HIGH signal on enable input EN1. Respective first and second regulator sub-circuits 320 and 330 will again behave as described above. The operation of first regulator sub-circuit 320 and second regulator sub-circuit 330 is summarized in Tables 1 and 2, respectively, below.

TABLE 1

| EN1 | T1 | T2 | OUT1 | T3 | A1 | B1 | OUT2 | T4 |
|---|---|---|---|---|---|---|---|---|
| 0 | ON | ON | VPP | OFF | 0 V | 0 V | GND | OFF |
| 1 | OFF | OFF | GND | ON | 1.3 V | VPP | VPP/2 | ON |

TABLE 2

| EN2 | T8 | T9 | OUT3 | T10 | A2 | B2 | OUT4 | T5 |
|---|---|---|---|---|---|---|---|---|
| 0 | ON | ON | VPP | OFF | 0 V | 0 V | GND | OFF |
| 1 | OFF | OFF | GND | ON | 1.3 V | VPP | VPP/2 | ON |

In one embodiment of the present invention, first regulator sub-circuit 320 is initially activated for a first period of time (e.g., 2–3 msec) while second regulator sub-circuit 330 is inactivated. At the end of the first period of time, and before capacitor leakage can cause VPP to shift beyond a predetermined tolerance level (e.g., 200 mV), second regulator sub-circuit 330 is activated for a second period of time (e.g., 1–3 nsec) while first regulator sub-circuit 320 is being "reinitialized," or inactive. At the end of the second period of time, first regulator sub-circuit is again activated for the first period of time (e.g., 2–3 msec) and second regulator sub-circuit is again inactivated. The process can then be repeated for as long as VPP needs to be regulated.

In a further embodiment, the first and second periods of time are equivalent and first and second regulator sub-circuits both share the duties of regulating VPP to the target voltage. In such a case, capacitors C1, C2, C3, and C4 would be identical in size and value. Capacitive leakage would no longer a problem since the voltages at nodes A1 and A2 would be periodically refreshed or reinitialized while the respective regulator sub-circuits are inactive. So long as first regulator sub-circuit 320 and second regulator sub-circuit 330 are alternatively enabled and disabled, VPP can remain in regulation virtually indefinitely (e.g., for many consecutive days).

In a preferred embodiment, the job of regulating VPP to the target voltage lies principally with first regulator sub-circuit 320. Consequently, the first period of time (i.e., the time that first regulator sub-circuit 320 is active) is approximately 2–3 msec and the second period of time (i.e., the time that second regulator sub-circuit 330 is active) is approximately 1 nsec. In other words, first regulator sub-circuit 320 is initially regulates VPP for about 2–3 msec. At the end of this first period of time, first regulator sub-circuit 320 is disabled and second regulator sub-circuit 330 is enabled or activated for 1 nsec while first regulator sub-circuit 320 is reinitialized.

At the end of the 1 nsec second period of time, first regulator sub-circuit 320 is again activated for another 2–3 msec and the process is repeated, with first regulator sub-circuit 320 being briefly reinitialized every 2–3 msec, for as long as a user wishes to regulate VPP. By minimizing the "on-time" of second regulator sub-circuit 330 to, for example, 1 nsec, the physical dimensions of capacitors C3 and C4 can be designed to be much smaller than that of capacitors C1 and C2. This translates into a reduction in die area required to implement the circuit of second regulator sub-circuit 330. While the preferred embodiment contemplates a first period of time of 2–3 msec and a second period of time of 1 nsec, a myriad of combinations of first and second periods of time can be devised to suit virtually any situation.

However, in all of the above embodiments, first and second regulator sub-circuits 320 and 330 are never simultaneously active (i.e., only one regulator sub-circuit is ever active at any given time). In other words, a logic HIGH signal should never be supplied to enable inputs EN1 and EN2 at the same time as this improperly connects node A1 to node A2. In a preferred embodiment, enable inputs EN1 and EN2 have a non-overlap period of 2–5 nsec.

Figure 3A:
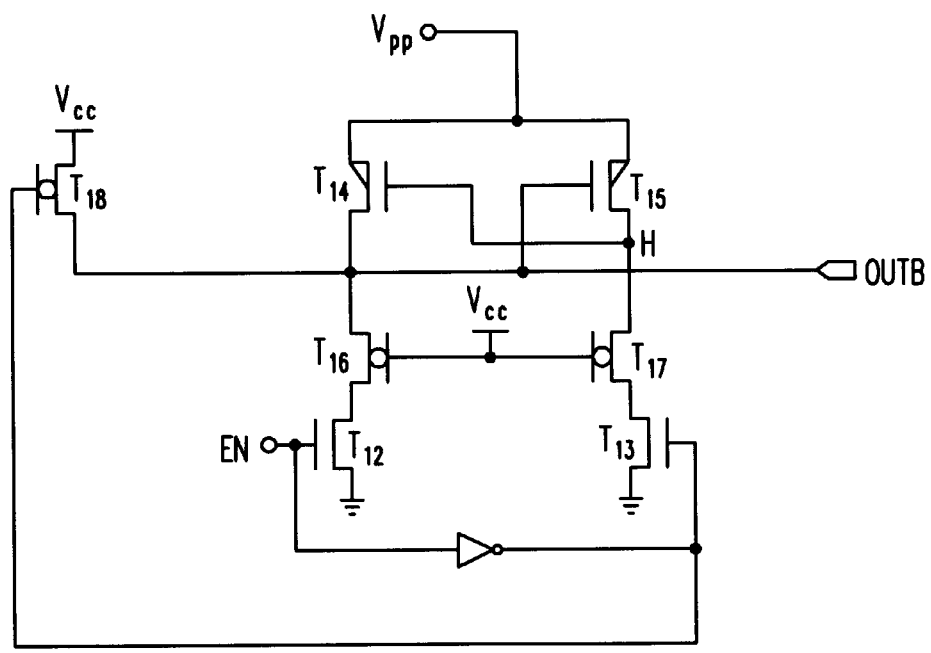
FIG. 3A is a schematic diagram of a level shifting high voltage switch as used in an embodiment of the present invention.

FIG. 3A illustrates level shifting high voltage switches 302 and 306 of first and second regulator sub-circuits 320 and 330, respectively. When enable input EN transitions to a logic HIGH state, transistor T12 is turned ON, transistor T13 is turned OFF, the voltage at output OUTB is pulled down to a ground potential or 0 V. Conversely, when enable input EN transitions to a logic LOW state, transistor T12 is turned OFF, transistor T13 is turned ON, the voltage at node H is pulled down to a ground potential or 0 V, and the 0 V on node H turns ON transistor T14. Output OUTB is thus connected to VPP and the voltage at output OUTB is eventually pulled up to VPP. In sum, when EN is in a logic HIGH state, the voltage at output OUTB is 0 V, and when EN is in a logic LOW state, the voltage at output OUTB is VPP or 9.5 V. Note that transistors T16, T17, and T18 prevent the hot-switching phenomena discussed earlier. The operation of respective level shifting high voltage switches 302 and 306 is summarized in Table 3 below:

TABLE 3

| EN | T12 | T13 | H | T14 | T15 | OUTB |
|---|---|---|---|---|---|---|
| 0 | ON | ON | VPP | OFF | 0 V | 0 V |
| 1 | OFF | OFF | GND | ON | 1.3 V | $V_{PP}$ |

Figure 3B:
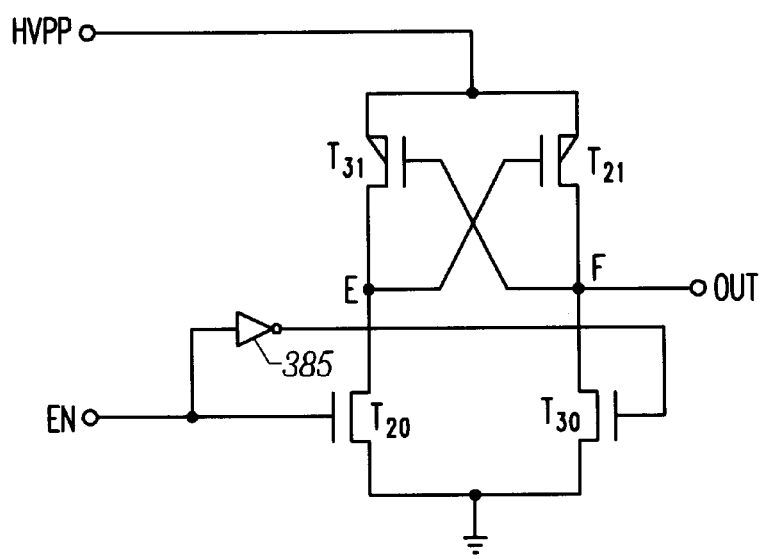
FIG. 3B is a schematic diagram of a medium voltage switch as used in an embodiment of the present invention.

FIG. 3B illustrates medium voltage switches 304 and 308 of first and second regulator sub-circuits 320 and 330, respectively. Medium voltage switches 304 and 308 are powered by HVPP (i.e., one-half of VPP or 4.75 V) and each switch comprises inverter 385, n-channel transistors T20 and T30, and p-channel transistors T21 and T31. When enable input EN transitions to a logic HIGH state, transistor T20 is turned ON, transistor T30 is turned OFF, the voltage at node E is pulled down to a ground potential or 0 V, and the 0 V on node E turns ON transistor T21. Node F thus becomes connected to HVPP and the voltage at node F and output OUT is eventually pulled up to HVPP.

However, when EN input transitions to a logic LOW state, transistor T20 is turned OFF, transistor T30 is turned ON, the voltage at node F is pulled to a ground potential or 0 V, transistor T31 is turned ON, and node E becomes connected to HVPP. The voltage at node E is thus eventually pulled up to HVPP. In sum, when EN is in a logic HIGH state, the voltage at output OUT is one-half of VPP or 4.75 V, and when EN is in a logic LOW state, output OUT is 0 V. The operation of respective medium voltage switches 304 and 308 is summarized in Table 4 below:

TABLE 4

| EN | T20 | E | T21 | T30 | F | T31 | OUT |
|----|-----|---|-----|-----|---|-----|-----|
| 0 | OFF | VPP/2 | OFF | ON | 0 V | ON | 0 V |
| 1 | ON | 0 V | ON | OFF | VPP/2 | OFF | VPP/2 |

In addition to being used in the myriad of applications and circuit designs requiring an output voltage to be continuously regulated, the present invention can also be used, for example, to reduce the time required to burn-in devices such as a non-volatile memory comprising regulator 300. Burn-in is reliability testing that applies thermal and electrical stresses to the non-volatile memory to induce premature failures in those memories which have inherent defects (or defects resulting from manufacturing aberrations which cause time and stress dependent failures).

One type of burn-in commonly used to test non-volatile memory devices is High Temperature Retention Bake (HTRB) testing. HTRB testing induces failures by, for example, applying a relatively large and constant bias voltage (e.g., VPP) at all word lines at ambient temperatures above 150° C. for several days. By eliminating the need to continually discharge and re-charge the output of charge pump 110, the output of charge pump 110 can remain in regulation for the entire duration of the HTRB testing. Without having to completely discharge and re-charge VPP every 2–3 msec, HTRB testing on a non-volatile memory can be completed in less time and can be performed using less power.

The foregoing description of the present invention has been provided for the purposes of illustration and description. It is not intended to be exhaustive or to limit the invention to the precise forms disclosed. Obviously, many modifications and variations will be apparent to practitioners skilled in this art. For example, various combinations of C1 and C2 or C3 and C4 could be used to adjust the voltage at nodes A1 and A2, respectively, so as to change the target output voltage at which the present invention will continuously regulate.

The embodiments were chosen and described in order to best explain the principles of the invention and its practical application, thereby enabling others skilled in the art to understand the invention for various embodiments and with various modifications as are suited to the particular use contemplated. Moreover, it should be noted that the language used in the foregoing description of the present invention has been principally selected for readability and instructional purposes, and may not have been selected to delineate or circumscribe the inventive subject matter. It is intended that the scope of the invention be defined by the following claims and their equivalents.

What is claimed is:

1. A method for continuously regulating an output voltage of a charge pump of a non-volatile memory to a target voltage wherein said non-volatile memory comprises a regulator comprising a first regulator sub-circuit and a second regulator sub-circuit, the method comprising the steps of:

(a) regulating said output voltage to said target voltage with said first regulator sub-circuit in conjunction with a single reference voltage for a first period of time;

(b) disabling said first regulator sub-circuit for a second period of time at the end of said first period of time; and (c) regulating said output voltage to said target voltage, at the end of said second period of time, with said second regulator sub-circuit in conjunction with said reference voltage for a third period of time while said first regulator sub-circuit is disabled.

2. The method of claim 1, further comprising the steps of:

(d) disabling said second regulator sub-circuit for a fourth period of time at the end of said third period of time; and (e) repeating steps (a)–(d) at the end of said fourth period of time.

3. The method of claim 1, wherein said first and second regulator sub-circuits comprise a capacitor divider network, said capacitor divider network comprising a first capacitor electrically coupled to a second capacitor at a voltage divider node.

4. The method of claim 3, wherein a voltage of said voltage divider node of said first regulator sub-circuit is reset to a value substantially equal to 1.3 V when said second regulator sub-circuit is disabled and said voltage divider node of said second regulator sub-circuit is reset to a value substantially equal to 1.3 V when said first regulator sub-circuit is disabled.

5. The method of claim 1, wherein said target output voltage is substantially equal to 9.5 V.

6. The method of claim 1, wherein said first period of time is equivalent to said second period of time.

7. The method of claim 6, wherein said first and second periods of time are greater than or substantially equal to one millisecond.

8. The method of claim 1, wherein only one of said first and second regulators are enabled at any given time.

9. The method of claim 1, wherein said second period of time is equivalent to said fourth period of time, said second and fourth periods of time being greater than or substantially equal to one nanosecond.

10. A non-volatile memory comprising:

a charge pump; and a regulator comprising a first regulator sub-circuit, and a second regulator sub-circuit, at least one of said first and second regulator sub-circuits comprising a capacitor divider network, wherein said first regulator sub-circuit regulates an output voltage of said charge pump at a target output voltage while said second regulator sub-circuit is disabled, said second regulator regulates said output voltage at said target output voltage while said first regulator sub-circuit is disabled, and said capacitor divider network of at least one of said first and second regulator sub-circuits is discharged while its respective regulator sub-circuit is disabled.

11. The memory of claim 10, wherein said first regulator sub-circuit regulates said output voltage of said charge pump at said target output voltage for a first period of time while said second regulator sub-circuit is disabled and, at the end of said first period of time, said first regulator sub-circuit is disabled for a second period of time, said second regulator sub-circuit is enabled, and said second regulator sub-circuit regulates said output voltage of said charge pump at said target output voltage for a third period of time while said second regulator sub-circuit is disabled.

12. The memory of claim 11, wherein at the end of said third period of time, said second regulator sub-circuit is disabled for a fourth period of time, and at the end of said fourth period of time, said first regulator sub-circuit is again enabled for said first period of time.

13. The memory of claim 10, wherein said first period of time is equivalent to said third period of time.

14. The memory of claim 13, wherein said first period of time is greater than or substantially equal to one millisecond.

15. The memory of claim 10, wherein said first period of time is not equivalent to said third period of time.

16. The memory of claim 10, wherein said second period of time is equivalent to said fourth period of time.

17. The memory of claim 16, wherein said second period of time is greater than or substantially equal to 1 nanosecond.

18. The memory of claim 10, wherein said capacitor divider network comprises a first capacitor coupled to a second capacitor at a voltage divider node, and a voltage at said voltage divider node is substantially equal to 1.3 V when said target output voltage is substantially equal to 9.5 V.

* * * * *